(12) United States Patent
Colosimo, Jr. et al.

(10) Patent No.: US 9,731,378 B2
(45) Date of Patent: Aug. 15, 2017

(54) THERMOCOMPRESSION BONDERS, METHODS OF OPERATING THERMOCOMPRESSION BONDERS, AND HORIZONTAL CORRECTION MOTIONS USING LATERAL FORCE MEASUREMENT IN THERMOCOMPRESSION BONDING

(71) Applicant: Kulicke and Soffa Industries, Inc., Fort Washington, PA (US)

(72) Inventors: Thomas J. Colosimo, Jr., West Chester, PA (US); Michael P. Schmidt-Lange, North Wales, PA (US); Horst Clauberg, Warwick, PA (US); Matthew B. Wasserman, Philadelphia, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 15/156,738

(22) Filed: May 17, 2016

(65) Prior Publication Data

US 2016/0343626 A1  Nov. 24, 2016

Related U.S. Application Data

(60) Provisional application No. 62/165,350, filed on May 22, 2015.

(51) Int. Cl.
*B23K 31/02* (2006.01)
*B23K 20/02* (2006.01)

(Continued)

(52) U.S. Cl.
CPC .......... *B23K 20/023* (2013.01); *B23K 1/0016* (2013.01); *B23K 3/00* (2013.01); *H01L 2224/11* (2013.01)

(58) Field of Classification Search
CPC ... H01L 24/75; H01L 24/81; H01L 2224/131; H01L 2224/81191; H01L 2224/81121;
(Continued)

(56) References Cited

U.S. PATENT DOCUMENTS

| | | | |
|---|---|---|---|
| 2005/0071991 A1* | 4/2005 | Yonezawa | H05K 13/0413 29/740 |
| 2007/0181653 A1* | 8/2007 | Michaelson | B23K 37/047 228/123.1 |

(Continued)

FOREIGN PATENT DOCUMENTS

| | | | |
|---|---|---|---|
| EP | 0772036 A2 * | 5/1997 | |
| JP | 03076236 A * | 4/1991 | |

*Primary Examiner* — Kiley Stoner
(74) *Attorney, Agent, or Firm* — Stradley Ronon Stevens & Young LLP

(57) ABSTRACT

A method of operating a thermocompression bonding system is provided. The method includes the steps of: (a) applying a first level of bond force to a semiconductor element while first conductive structures of the semiconductor element are in contact with second conductive structures of a substrate in connection with a thermocompression bonding operation; (b) measuring a lateral force related to contact between (i) ones of the first conductive structures and (ii) corresponding ones of the second conductive structures; (c) determining a corrective motion to be applied based on the lateral force measured in step (b); and (d) applying the corrective motion determined in step (c).

23 Claims, 14 Drawing Sheets

(51) Int. Cl.
*B23K 3/00* (2006.01)
*B23K 1/00* (2006.01)

(58) Field of Classification Search
CPC . H01L 2224/75252; H01L 2224/81815; H01L 24/13; H01L 24/16; H01L 2224/13082; H01L 2224/16238; H01L 2224/75824; H01L 2224/75841; H01L 2224/75804; H01L 2224/81203; H01L 2224/11; B23K 20/023; B23K 20/002; B23K 1/0016; B23K 3/00–3/087; B23K 2201/36–2201/42
USPC ......... 228/102–103, 105, 179.1–180.22, 4.1, 228/6.2, 8–12, 44.7, 49.5
See application file for complete search history.

(56) References Cited

U.S. PATENT DOCUMENTS

| | | | |
|---|---|---|---|
| 2011/0209548 A1* | 9/2011 | Geisler | H01L 22/12 73/627 |
| 2012/0127485 A1* | 5/2012 | Yamauchi | H01L 24/75 356/614 |
| 2013/0323531 A1* | 12/2013 | Nakagawa | B23K 20/021 428/648 |

* cited by examiner

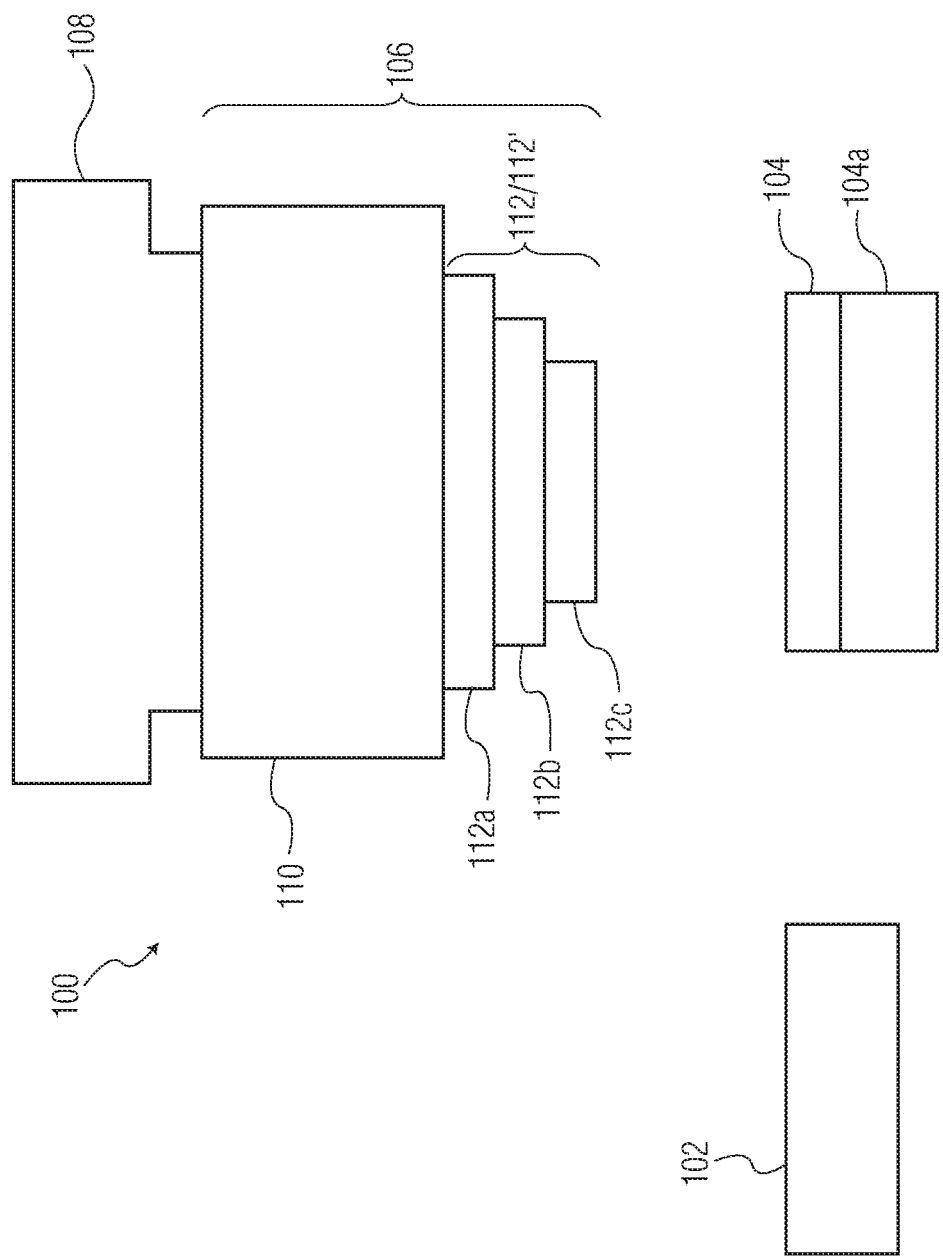

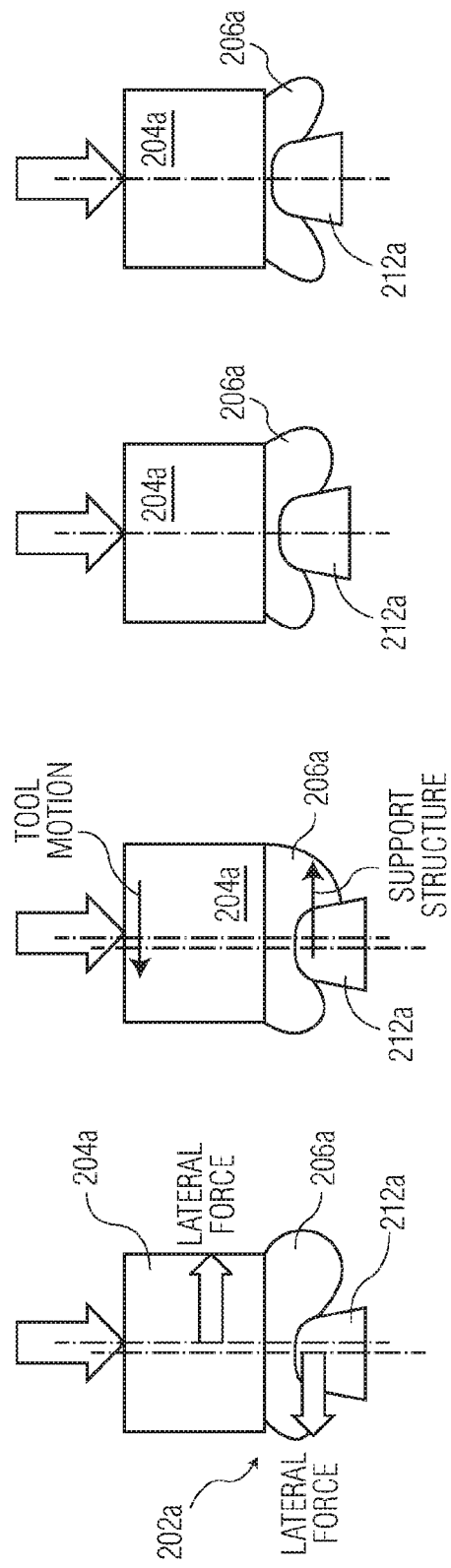

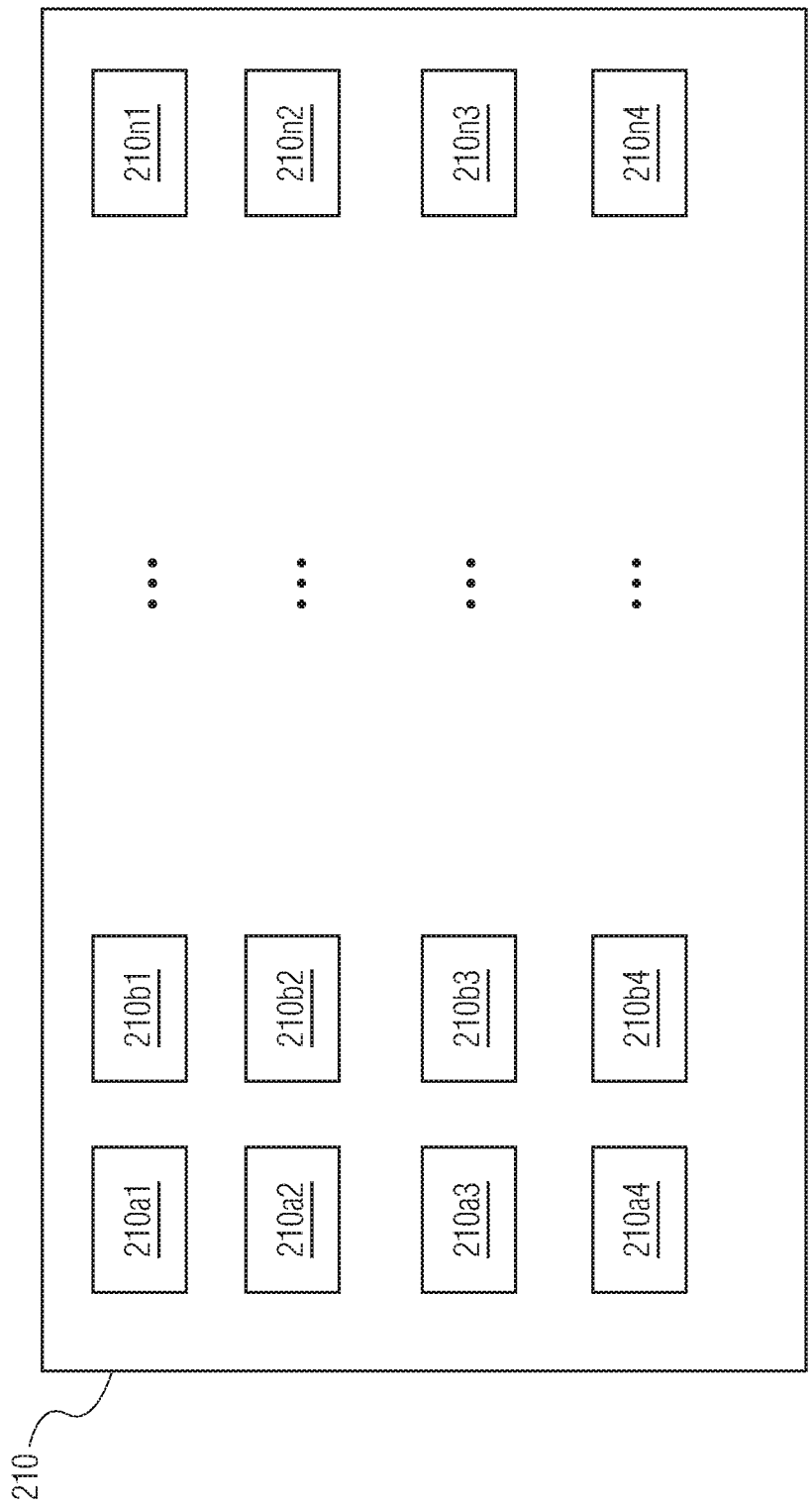

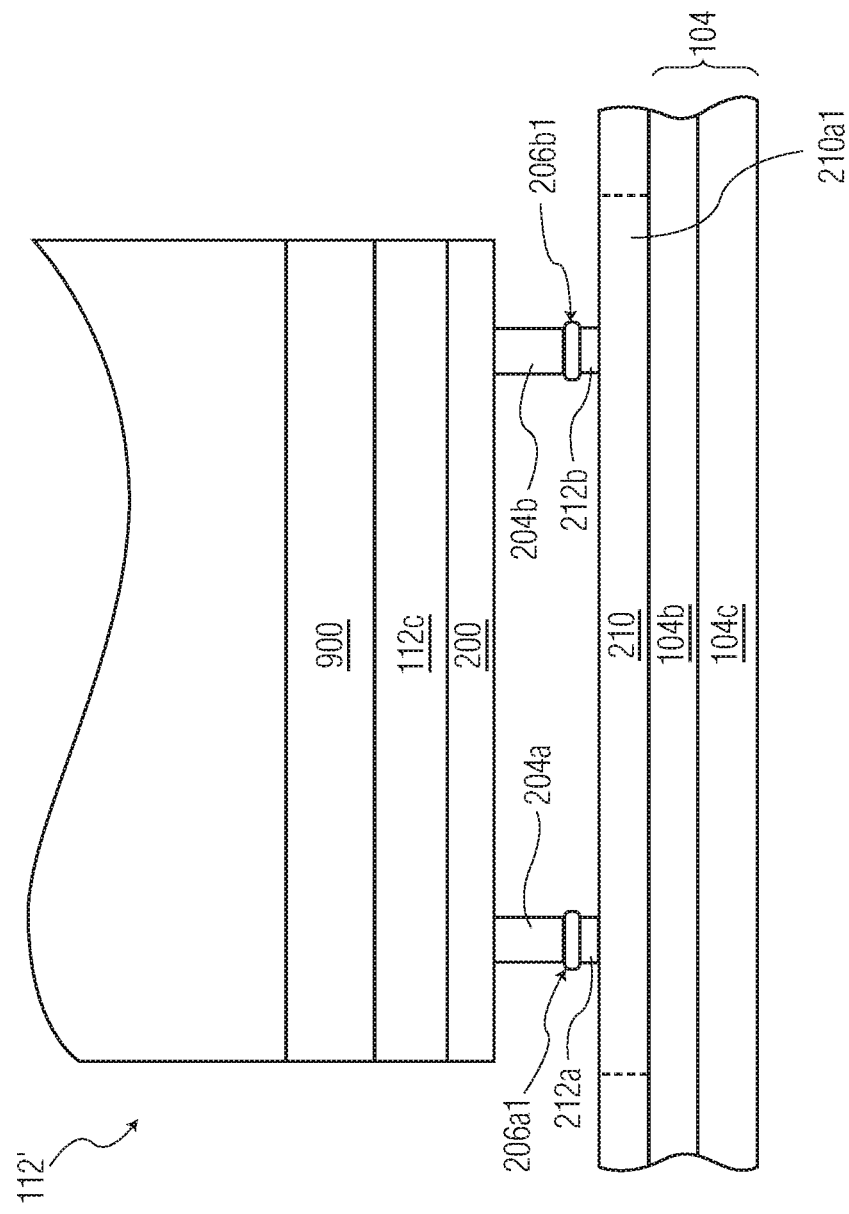

THERMOCOMPRESSION BONDERS, METHODS OF OPERATING THERMOCOMPRESSION BONDERS, AND HORIZONTAL CORRECTION MOTIONS USING LATERAL FORCE MEASUREMENT IN THERMOCOMPRESSION BONDING

CROSS-REFERENCE TO RELATED APPLICATION

This application claims the benefit of U.S. Provisional Patent Application No. 62/165,350, filed May 22, 2015, the content of which is incorporated herein by reference.

FIELD

The invention relates to the formation of electrical interconnections in semiconductor packages, and more particularly, to improved thermocompression bonding systems and methods of operating the same.

BACKGROUND

In certain aspects of the semiconductor packaging industry, semiconductor elements are bonded to bonding locations. For example, in conventional die attach (also known as die bonding) applications, a semiconductor die is bonded to a bonding location of a substrate (e.g., a leadframe, another die in stacked die applications, a spacer, etc.). In advanced packaging applications, semiconductor elements (e.g., bare semiconductor die, packaged semiconductor die, etc.) are bonded to bonding locations of a substrate (e.g., a leadframe, a PCB, a carrier, a semiconductor wafer, a BGA substrate, etc.). Conductive structures (e.g., traces, conductive bumps, contact pads, solder bumps, conductive pillars, copper pillars, etc.) provide electrical interconnection between the semiconductor elements and the bonding locations.

In many applications (e.g., thermocompression bonding of semiconductor elements), solder material is included in the conductive structures. In such processes, heat is applied to the semiconductor element being bonded (e.g., through a heater in a bond head assembly carrying the bond tool and/or through the support structure supporting the substrate). Misalignment between conductive structures of the semiconductor element and the substrate continue to be a challenge in certain thermocompression bonding operations. Thus, it would be desirable to provide improved methods for operating thermocompression bonding systems to overcome certain misalignment challenges.

SUMMARY

According to an exemplary embodiment of the invention, a method of operating a thermocompression bonding system is provided. The method includes the steps of: (a) applying a first level of bond force to a semiconductor element while first conductive structures of the semiconductor element are in contact with second conductive structures of a substrate in connection with a thermocompression bonding operation; (b) measuring a lateral force related to contact between (i) ones of the first conductive structures and (ii) corresponding ones of the second conductive structures; (c) determining a corrective motion to be applied based on the lateral force measured in step (b); and (d) applying the corrective motion determined in step (c).

According to another exemplary embodiment of the invention, another method of operating a thermocompression bonding system is provided. The method includes the steps of: (a) measuring, at each of a plurality of bonding locations of a substrate, a lateral force related to contact between (i) ones of first conductive structures of a semiconductor element and (ii) corresponding ones of the second conductive structures of the substrate; (b) determining a corrective motion, specific to each of the plurality of bonding locations, to be applied based on the lateral force measured in step (a).

According to yet another exemplary embodiment of the invention, a thermocompression bonder is provided. The thermocompression bonder includes: a support structure for supporting a substrate; a bond head carrying a bonding tool for bonding a semiconductor element to the substrate, wherein at least one of the bond head and the support structure includes a force sensor for sensing a lateral force related to contact between (i) ones of first conductive structures of the semiconductor element and (ii) corresponding ones of second conductive structures of the substrate.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 1 is a block diagram view of portions of a thermocompression bonder, including a bond head assembly, in accordance with an exemplary embodiment of the invention;

FIGS. 3A-3D are a series of block diagram views of interconnections between conductive structures during a thermocompression bonding operation in accordance with an exemplary embodiment of the invention;

FIG. 7 is an overhead block diagram view of a substrate including a plurality of bonding locations useful in connection with various exemplary embodiments of the invention;

FIG. 9 is a block diagram view of portions of a thermocompression bonder including a force sensor in accordance with an exemplary embodiment of the invention.

DETAILED DESCRIPTION OF THE INVENTION

Figure 2B:
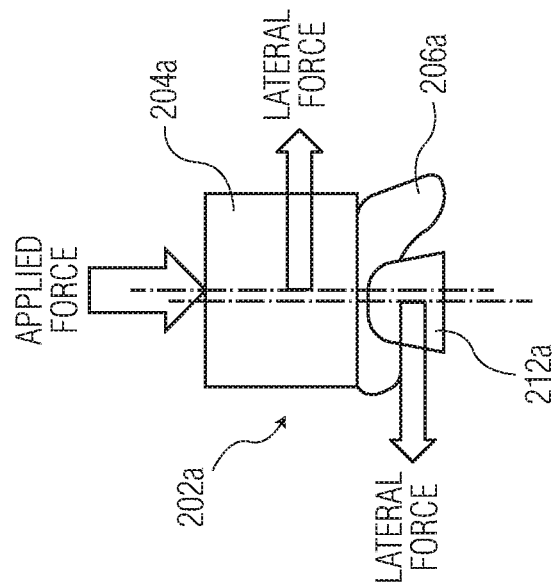
FIGS. 2A-2B are block diagram illustrations of proper, and improper, alignment between conductive structures during a thermocompression bonding operation.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semicondcutor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., an interposer, a spacer to be bonded in a stacked die configuration, a substrate, etc.).

As used herein, the terms "substrate" and "workpiece" are intended to refer to any structure to which a semiconductor element may be bonded (e.g., thermocompressively bonded, etc.). Exemplary substrates include, for example, a leadframe, a PCB, a carrier, a semiconductor chip, a semicondcutor wafer, a BGA substrate, a semiconductor element, etc.

As used herein, the terms "corrective motion", "corrective motions", and "corrective motion(s)" are used interchangeably. For example, the term "corrective motion" may apply to: one motion of a single structure (e.g., motion of a bonding tool, motion of a substrate support structure, etc.); multiple motions of a single structure (e.g., motions of a bonding tool, motions of a substrate support structure, etc.) in the same or different directions; and one or more motions of multiple structures (e.g., motion(s) of a bonding tool and motion(s) of a substrate support structure, etc.).

According to certain exemplary embodiments, the invention relates to thermocompression bonding of semiconductor die, and is highly applicable to the thermocompressive bonding of such semiconductor die to substrate traces (e.g., copper traces on organic substrates, or other materials, etc.). The invention has many other applications, for example, bonding a semiconductor die onto another semiconductor die (e.g., die stacking), or bonding a semiconductor die onto a wafer or interposers (e.g., Si, glass, etc.).

A very specific application of the invention includes the thermocompression bonding of a semiconductor die (including copper pillars on the die, and solder cap/contact portions on the copper pillars) to a substrate having conductive structures (e.g., bumps, traces, etc.) that are smaller than (or similar in size to the diameter of the copper pillars on the die). In such an application, a small offset in initial placement (alignment between the semiconductor die and the substrate) can cause lateral forces to develop during vertical compression. The lateral forces put undesirable stress on the conductive structures on the substrate, which could cause damage at the interface between such conductive structures and the die, or damage to internal layers (such as dielectrics) of the die, as well as further positional errors.

To reduce the potential undesirable effects of such offsets in initial placement, in accordance with certain exemplary embodiments of the invention, the use of horizontal placement correction motions are provided as part of a thermocompression bonding process. During formation of a thermocompression bond, lateral forces can arise. For example, such lateral forces may arise if the second conductive structures on the substrate (e.g., conductive traces, bumps, etc.) being bonded to are smaller than or similar in size to the first conductive structures on the semiconductor element being bonded (e.g., Cu pillar bumps), and/or if there is an initial offset (even small ones) in the placement of the first conductive structures onto the corresponding second conductive structures. Such lateral forces may be considered as an indication of the direction and magnitude of the initial placement error. According to certain exemplary aspects of the invention, the lateral forces are first measured, and then a corrective motion is calculated from the measurement of the lateral forces. In a very specific and simple embodiment of the invention, the lateral forces are measured after applying an intermediate vertical force (e.g., where the intermediate vertical force is smaller than the final vertical force), then the corrective motion is applied, and then the final vertical force is applied.

Referring now to the drawings, FIG. 1 illustrates exemplary thermocompression bonder 100. Thermocompression bonder 100 includes bond head assembly 106 including upper bond head 110 (driven by motion system 108, for example, along any desired axes such as only the vertical z-axis for providing bond force during thermocompression bonding, or the vertical z-axis and any combination of the horizontal x-axis and y-axis) and lower bond head 112/112' (see lower bond head 112' in FIG. 9). Lower bond head 112/112' is coupled to upper bond head 110. As such, various motions of upper bond head 110 will result in corresponding motions of lower bond head 112/112'. Such motions may be provided, for example, by motion system 108 (e.g., including servo controlled linear motors for moving bond head assembly 106 along the desired axes). Lower bond head 112/112' includes base structure 112a (which desirably includes cooling channels for receiving a fluid for cooling heater 112b during cooling phases of the process), heater 112b, and bonding tool 112c. As will be appreciated by those skilled in the art, heater 112b may be a heated bond tool configured to carry and bond a semiconductor element (not shown in FIG. 1), and as such, a separate bonding tool 112c may be omitted. That is, the terms heater and bond/bonding tool may be used interchangeably, and may be integrated into a single component or may be multiple separate components (as shown in the exemplary embodiment illustrated in FIG. 1). Heater/bonding tool 112b/112c bonds a semiconductor element to a substrate at bonding station 104. Bonding station 104 includes motion system 104a for moving a support structure of bonding station 104 along one or more axes. For example, a servo controlled linear motor may be used to provide such motion along the x-axis, along the y-axis, along both the x-axis and the y-axis, etc. In a direct pick and place embodiment, heater/bonding tool 112b/112c may pick a semiconductor element from supply station 102 (e.g., a semiconductor wafer or other structure providing semiconductor elements), and bond the element to a substrate at bonding station 104. Embodiments using a transfer between a pick tool and a place tool (or a plurality of transfers) are also contemplated.

Figure 2A:
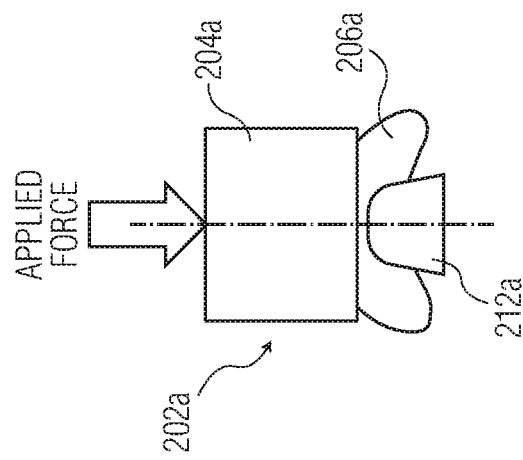

FIGS. 2A-2B illustrate portions of a conductive interconnect structure during a thermocompression bonding process. An upper conductive structure 202a (included on a die, not shown) includes a conductive pillar 204a and a solder contact portion 206a (already deformed in FIG. 2A). Upper conductive structure 202a is bonded to lower conductive structure 212a of a substrate (the substrate is also not shown in FIG. 2A). In FIG. 2A, upper conductive structure 202a is properly aligned with lower conductive structure 212a, and as such no problematic lateral forces are shown. In contrast, in FIG. 2B, upper conductive structure 202a is not properly aligned with lower conductive structure 212a. That is, as shown by the offset of the center line of the interconnect, upper conductive structure 202a is offset from (and not in proper alignment with) lower conductive structure 212a. This has the undesirable results described above, that is, lateral forces are shown in a direction substantially perpendicular to the vertical bond force axis. Such lateral forces are undesirable and might cause damage to the die and/or substrate, and may push the devices sideways and create further position errors.

FIGS. 3A-3D (which show structures similar to those described above in connection with FIGS. 2A-2B) illustrate operation of a thermocompression bonder involving the application of a lateral movement(s) based on a lateral force measurement(s). FIG. 3A illustrates upper conductive structure 202a not properly aligned with lower conductive structure 212a, after the application of an intermediate level of vertical force (not a full amount of bond force). That is, as shown by the offset of the center line of the interconnect, upper conductive structure 202a is offset from (and not in proper alignment with) lower conductive structure 212a. During this period of misalignment, a lateral force is measured, which gives an indication of the direction and magnitude of the lateral offset. The measurement may be accomplished, for example: (a) using a force sensor(s) provided in the bond head or the support structure (e.g., a strain gauge, a force transducer, one or more load cells, etc.), such as force sensor 900 shown in FIG. 9; and/or (b) by measuring the force applied by the lateral motors to fight the lateral force generated by the solder deformation (e.g., by monitoring motor characteristics such as motor current of a motor driving the bond head and/or the support structure, etc.). Based on this measurement: (1) an appropriate amount of lateral motion (e.g., a corrective motion) is calculated to overcome the lateral force and correct (or possibly even overcompensate for by overshooting) the initial offset; or (2) after measuring the lateral force, an even greater lateral force may be applied (e.g., to the upper and/or lower conductive structure) to provide proper alignment, where the even greater lateral force results in a corrective motion. As shown in FIGS. 3B-3C, the corrective motion is applied. In FIG. 3B, lateral motion is illustrated (by arrows pointing to the left and right) in connection with both the upper conductive structure 202a and the lower conductive structure 212a. It is understood that either or both of these conductive structures may be moved using the corresponding motion system (e.g., motion systems 108, 104a shown in FIG. 1). After the corrective motion is applied, the full vertical force (e.g., the design bond force for the thermocompression bonding operation) is applied at FIG. 3D.

Figure 4A:
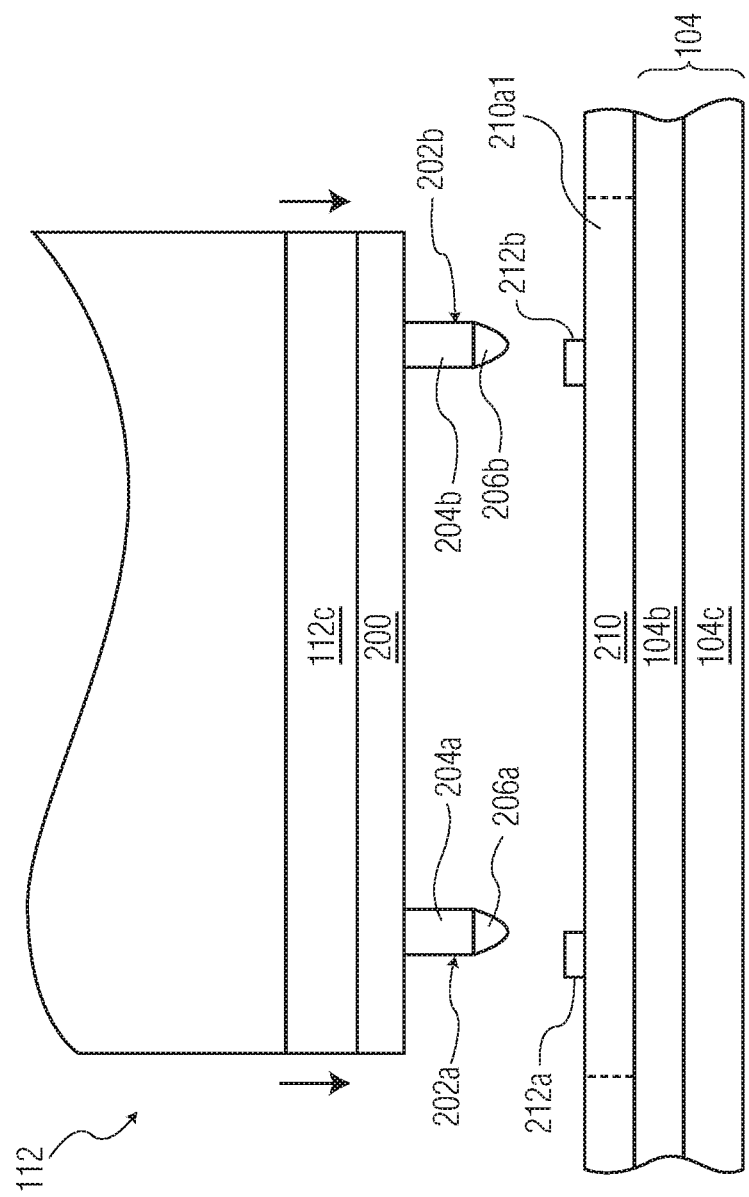
FIGS. 4A-4D are block diagram views of portions of a thermocompression bonder during a thermocompression bonding operation in accordance with an exemplary embodiment of the invention.
Figure 4B:
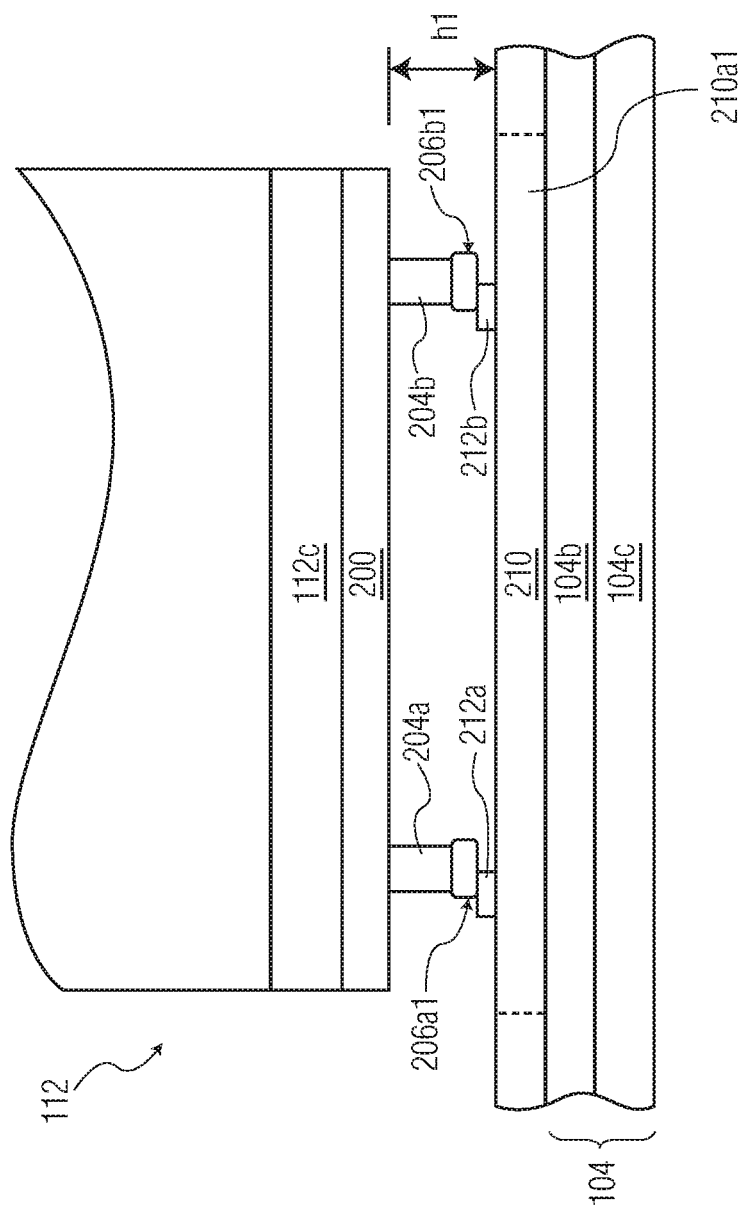

FIG. 4A illustrates bonding tool 112c (included in lower bond head 112) carrying semiconductor element 200 (e.g., a semiconductor die). Upper conductive structures 202a, 202b (e.g., each including respective conductive pillars 204a, 204b such as copper pillars, and corresponding solder contact portions 206a, 206b) are provided on semiconductor element 200. As shown in FIG. 4A, bonding tool 112c is being lowered such that such that upper conductive structures 202a, 202b contact lower conductive structures 212a, 212b on bonding location 210a1 of substrate 210 (as will be appreciated, a substrate may include a plurality of bonding locations configured to receive a plurality of semiconductor elements). In the example shown in FIG. 4A, substrate 210 is supported by bonding station 104, where bonding station includes a support structure 104b (e.g., an application specific part) on a bond stage 104c. In FIG. 4B, through a thermocompressive bonding process at an intermediate level of vertical (bond) force, solder contact portions 206a, 206b are partially reshaped as solder interfaces 206a1, 206b1, providing a conductive coupling between ones of upper conductive structures 202a, 202b and respective lower conductive structures 212a, 212b. As shown in FIG. 4B, there is an offset between ones of upper conductive structures 202a, 202b and respective lower conductive structures 212a.

At this intermediate level of bond force, a lateral force is measured which gives an indication of the direction and magnitude of the lateral offset. This measurement is used to determine a corrective motion(s) to be applied based on the lateral force measured. At FIG. 4C, the corrective motion(s) is applied by motion of at least one of bonding tool 112c and support structure 104b (e.g., where the motion is provided by the corresponding motion system(s), such as systems 108 and 104a shown in FIG. 1). At FIG. 4D, with a proper alignment because of the corrective motion(S) described above, the full vertical (bond) force is applied, thereby further reshaping solder contact portions 206a1, 206b1 into reshaped solder interfaces 206a2, 206b2. Although FIGS. 4A-4D illustrate only two pairs of conductive structures, this is of course a simple example for ease of explanation. In practice, any number of pairs of conductive structures may be provided (e.g., tens of conductive structure pairs, hundreds of conductive structure pairs, etc.).

Figure 4C:
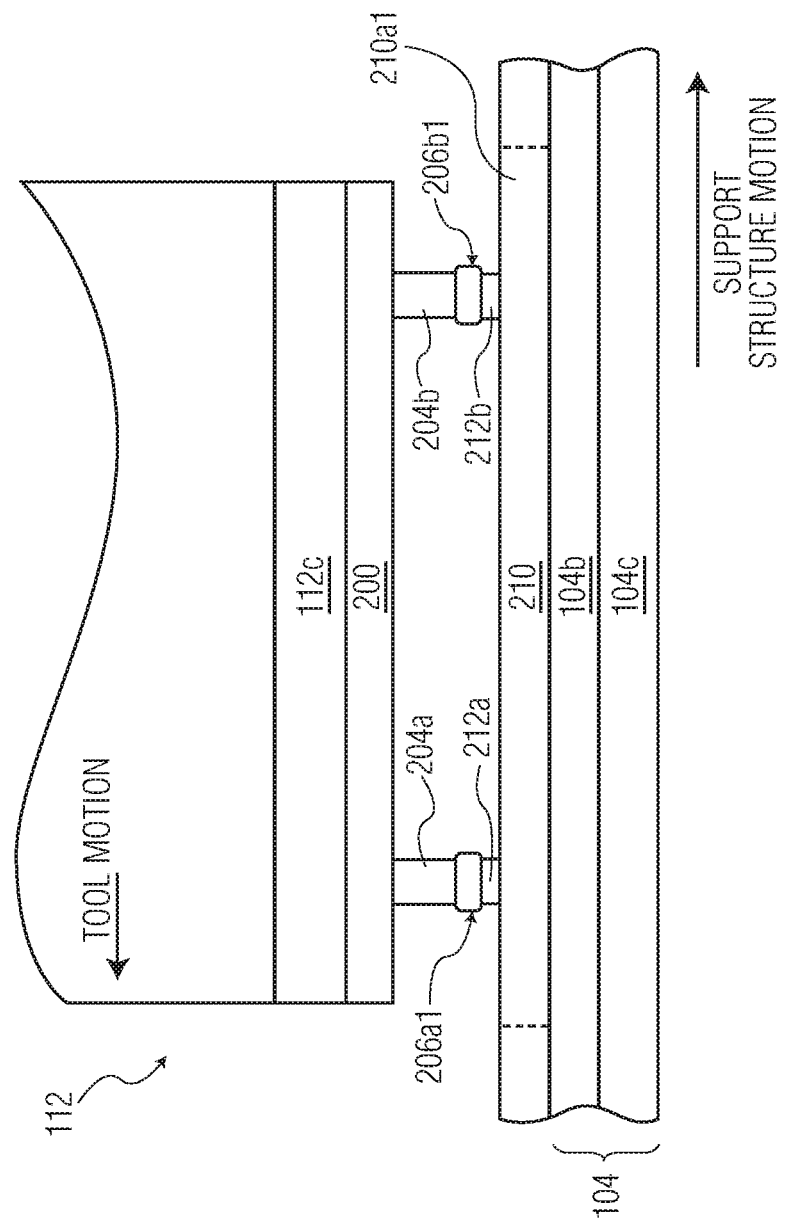
Figure 4D:
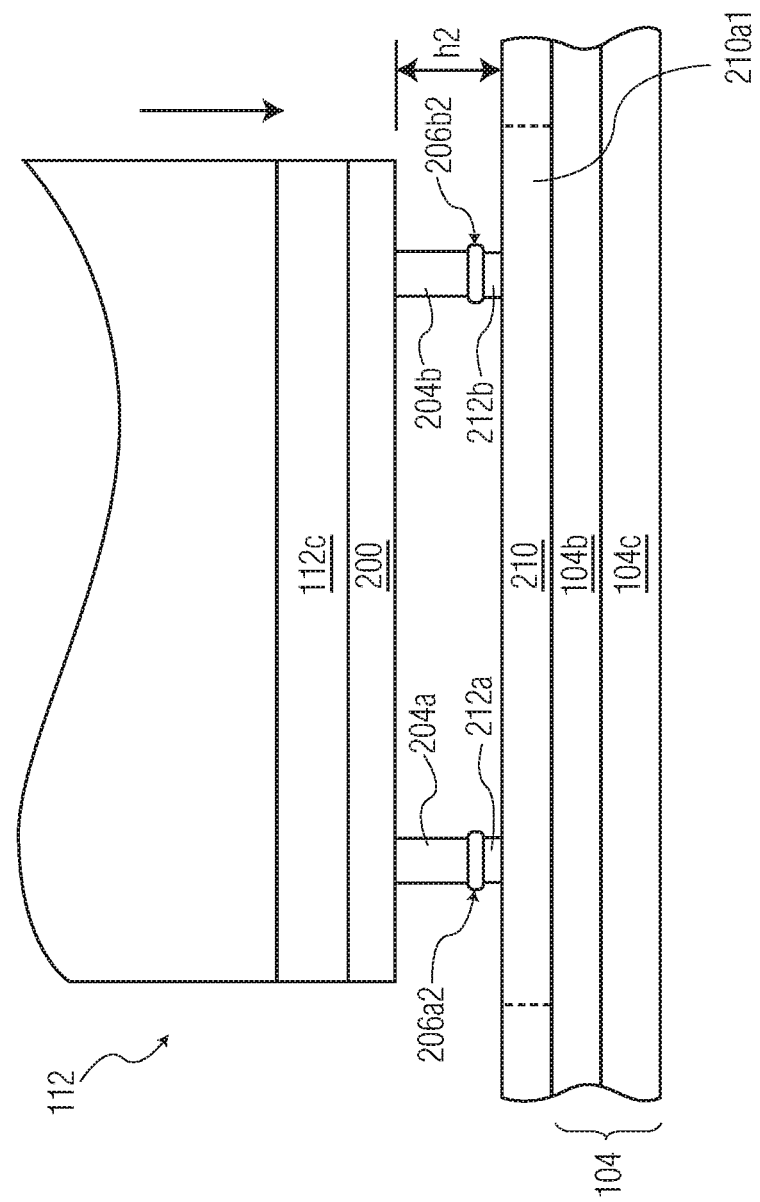
Figure 5:
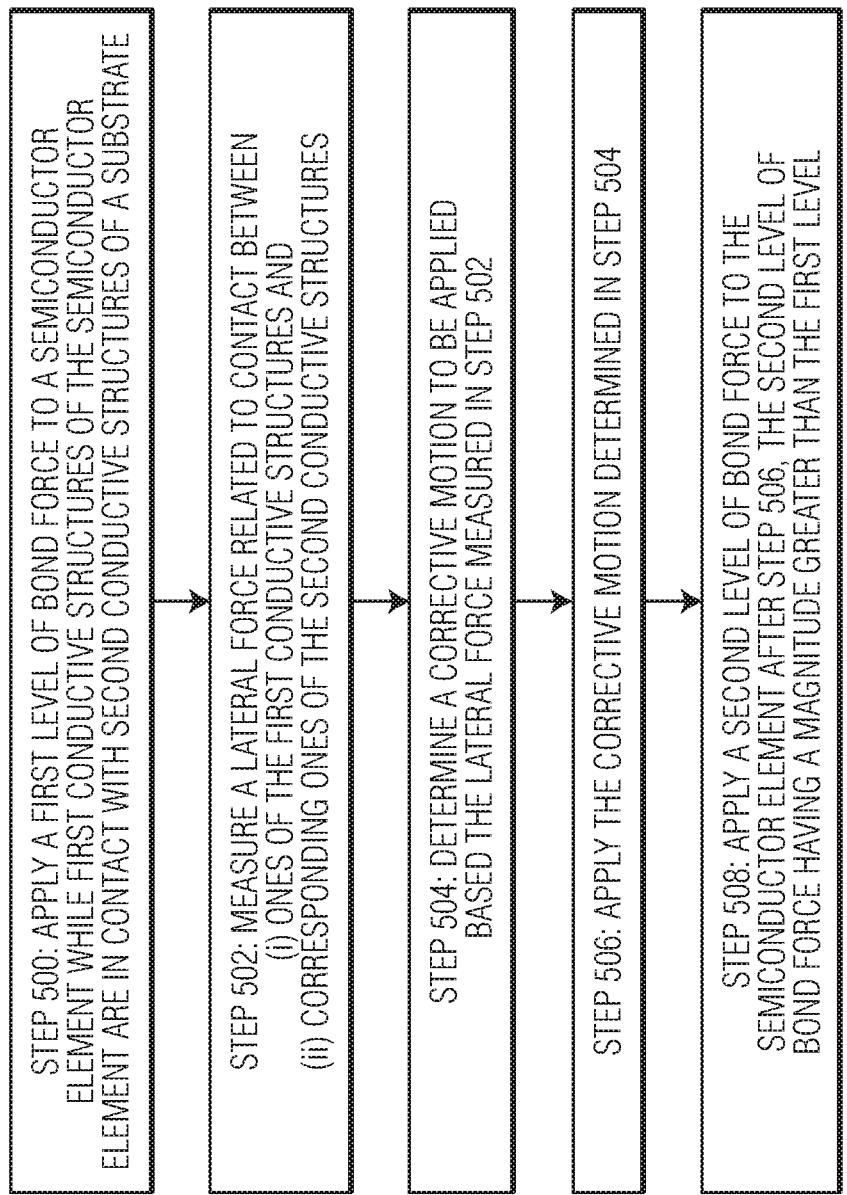
FIG. 5 is a flow diagram illustrating a method of operating a thermocompression bonder in accordance with an exemplary embodiment of the invention.

FIG. 5 illustrates a method of operating a thermocompression bonding system (e.g., a thermocompression bonder). At step 500, a first level of bond force is applied to a semiconductor element while first conductive structures of the semiconductor element are in contact with second conductive structures of a substrate. For example, such a first level of bond force is illustrated and described in connection with FIGS. 3A and 4B. At step 502, a lateral force is measured related to contact between (i) ones of the first conductive structures and (ii) corresponding ones of the second conductive structures. For example, this measurement may be accomplished in the positions shown in FIGS. 3A and 4B. At step 504, a corrective motion to be applied based on the lateral force measured in Step 502 is determined. At step 506, the corrective motion determined in Step 504 is applied. For example, FIGS. 3B and 4C illustrate such a correction motion (e.g., see the arrows directed laterally). At step 508, after the corrective motion is applied in Step 506, a second level of bond force is applied to the semiconductor element. The second level of bond force has a magnitude greater than the first level, and in certain embodiments of the invention may be considered the full bond force.

FIGS. 3A-3D, 4A-4D, and 5 relate to real time active compensation (i.e., through a corrective motion(s)) for a lateral force measured just prior to the compensation. However, aspects of the invention relate to prior determination of corrective motions that will be applied in the future. For example, in the case of bonding to a substrate including a plurality of bonding locations, corrective motions may be determined specific to each of the bonding locations in advance of production. Then, during production bonding, the appropriate corrective motion may be applied. Further, during bonding using the previously determined corrective motion, lateral forces may continue to be measured with the resultant force data to be used in connection with an updated closed loop corrective motion.

Figure 6A:
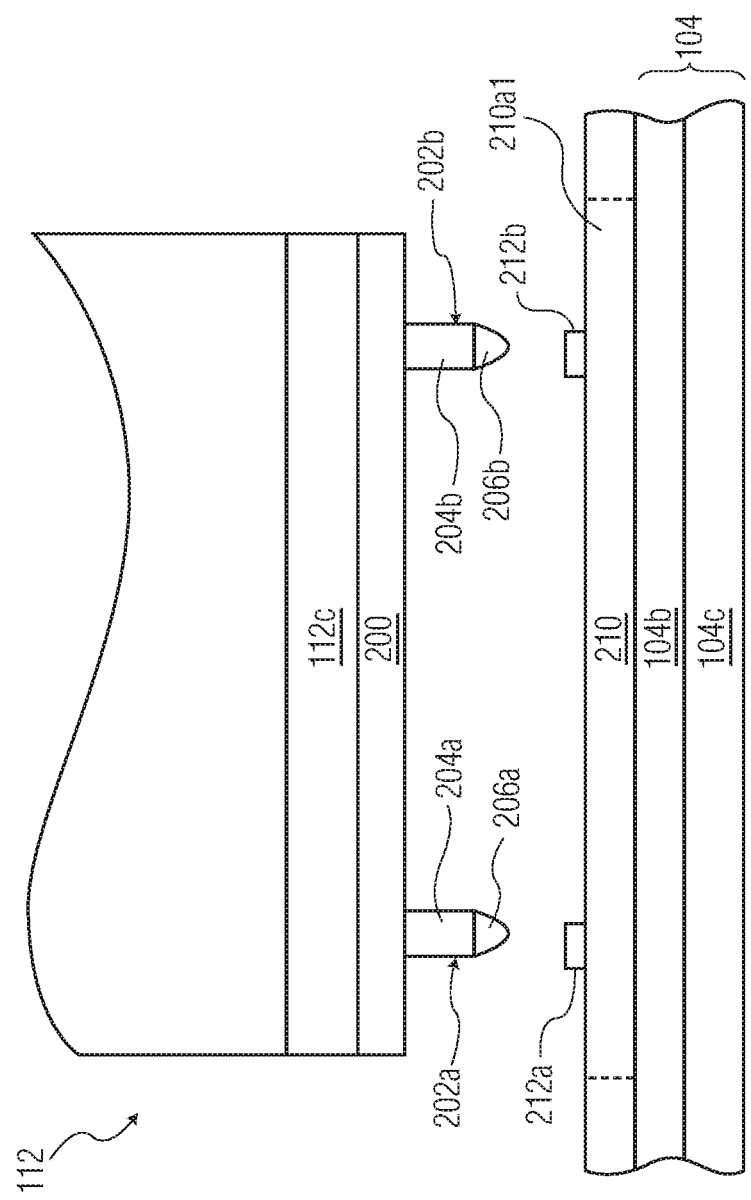
FIGS. 6A-6C are block diagram views of portions of a thermocompression bonder during a thermocompression bonding operation in accordance with an exemplary embodiment of the invention.
Figure 6B:
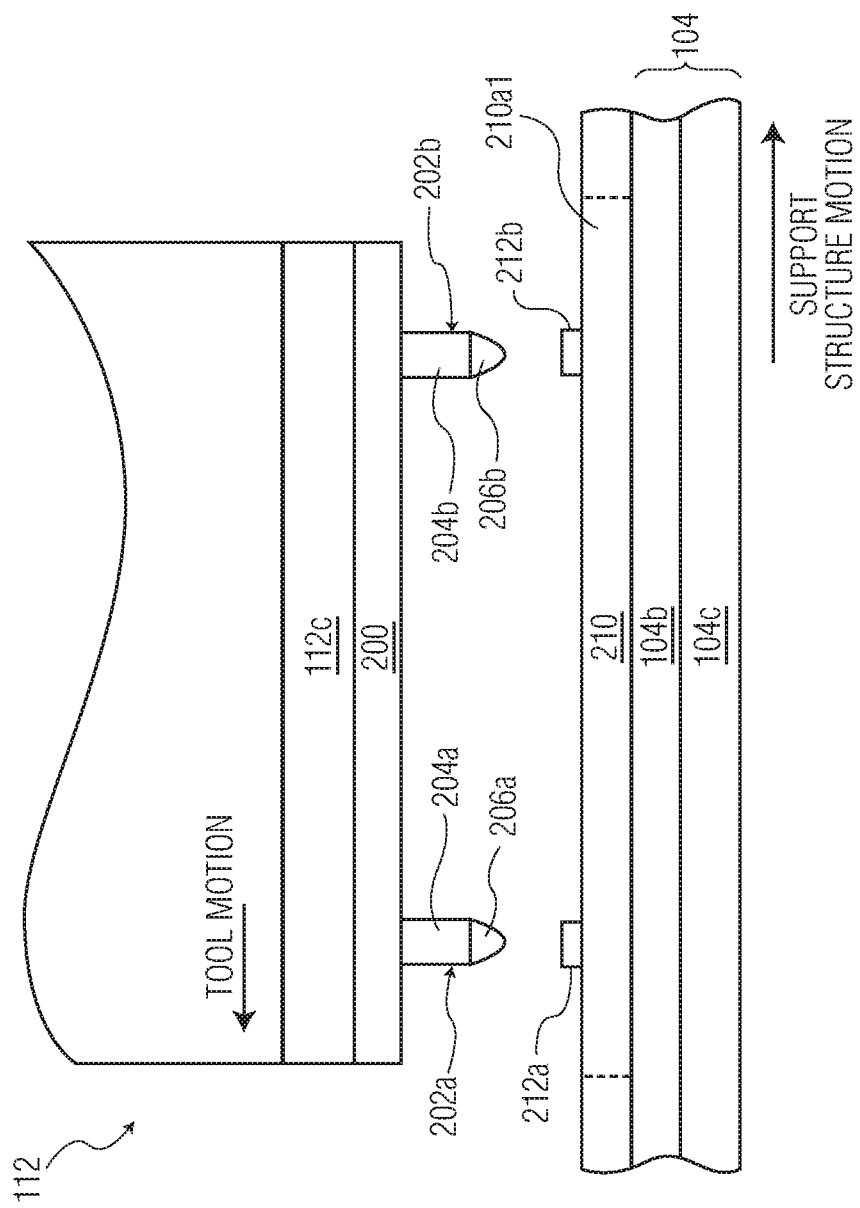
Figure 6C:
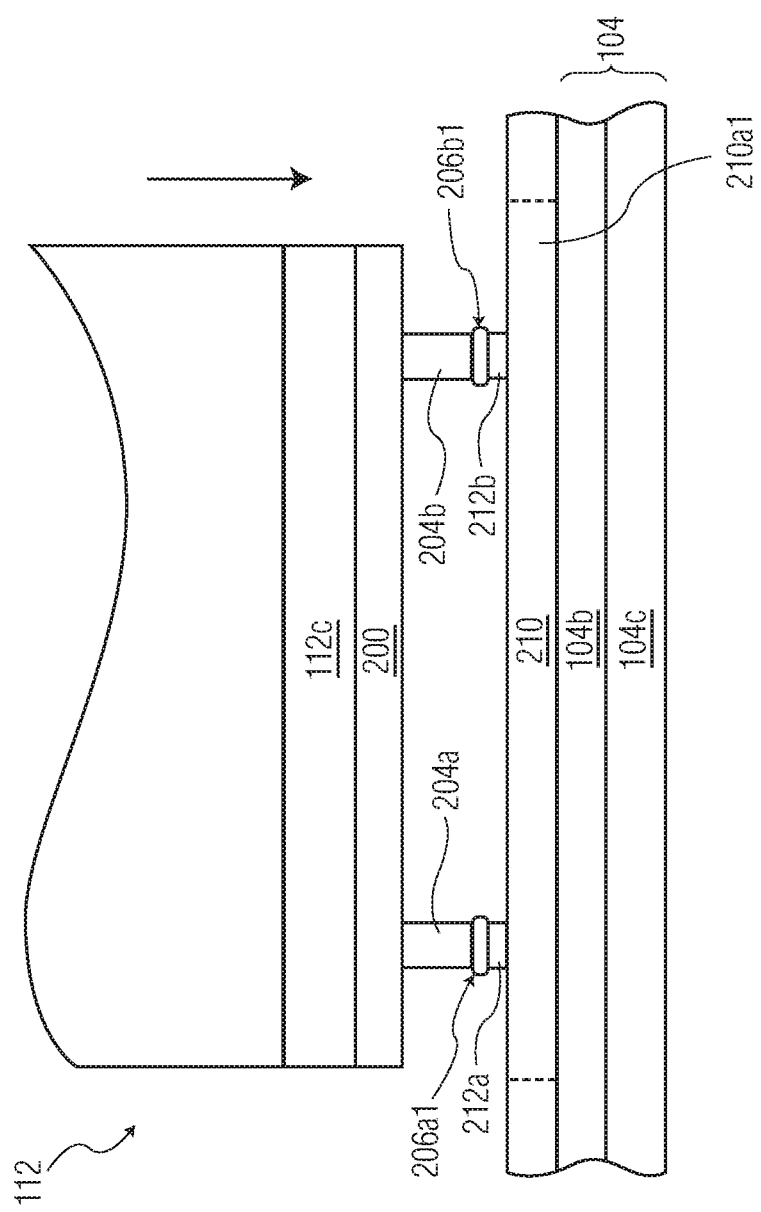

FIG. 6A illustrates the same elements of lower bond head 112 (carrying semiconductor element 200), and of bonding station 104 (supporting substrate 210), as in FIGS. 4A-4D, with the same offset between element 200 and bonding location 210a1. However, in FIG. 6A, a corrective motion(s) to overcome the offset has previously been determined (e.g., using the techniques described above in connection with FIGS. 3A-3D, 4A-4D, and 5). Thus, in FIG. 6B, one (or both) of bonding tool 112c and support structure 104b is moved to overcome the offset prior to contact between the corresponding conductive structures. Then, at FIG. 6C, bonding tool 112c is lowered to thermocompressively bond upper conductive structures 202a, 202b to corresponding lower conductive structures 212a, 212b.

FIG. 7 illustrates substrate 210, including columns and rows of bonding locations in a grid arrangement. A corrective motion, specific to each bonding location 210a1, 210a2, etc. may be determined as provided above.

Figure 8:
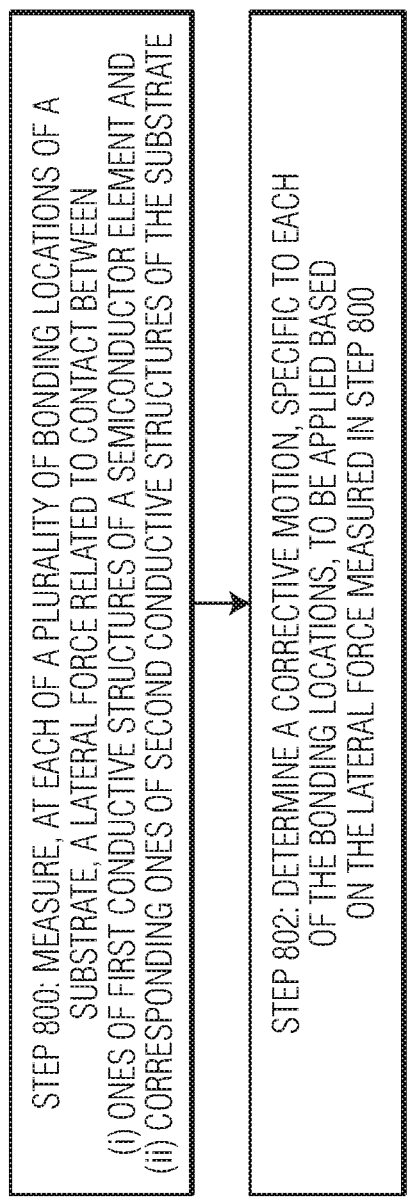
FIG. 8 is a flow diagram illustrating a method of operating a thermocompression bonder in accordance with an exemplary embodiment of the invention.

FIG. 8 illustrates a method of operating a thermocompression bonding system. At step 800, a lateral force related to contact between (i) ones of first conductive structures of a semiconductor element and (ii) corresponding ones of second conductive structures of the substrate is measured at each of a plurality of bonding locations of a substrate. At step 802, a corrective motion specific to each of the bonding locations, to be applied based on the lateral force measured in step 800, is determined.

As will be appreciated by those skilled in the art, the method illustrated in FIG. 8 (and the methods described in connection with FIGS. 6A-6C and FIG. 7) may be used to measure lateral forces, and to determine corrective motions, to be used in future placement. That is, a placement corrective "map" (or corresponding data) may be generated with corrective motions associated with each bonding location of the substrate support structure (e.g., chuck). The corrective motions for each bonding location may be determined by taking a number of different lateral force measurements at the respective bonding location (e.g., in the same or different conditions, such as temperature, time, etc.), and then using using an averaging or another mathematical formulation to determine a corresponding corrective motion. It will also be appreciated that the lateral forces used to determine a corrective motions for future bonds may be measured either at an intermediate force or under the full bond force.

FIG. 9 illustrates elements identical to those illustrated and described above in connection with FIGS. 4A-4D, except that lower bond head 112 is replaced with lower bond head 112' in FIG. 9. Lower bond head 112' includes a force sensor 900 for sensing/measuring a lateral force related to contact between (i) ones of upper conductive structures 202a, 202b of semiconductor element 200 and (ii) corresponding ones of lower conductive structures 212a, 212b of substrate 210. Force sensor 900 may take a number of configurations. In one specific configuration, force sensor 900 may include a load cell. In another example, force sensor 900 may include a plurality of load cells (e.g., three load cells). Such load cells, while typically are used to measure vertical (z-axis) forces, may also be effective to measure the desired lateral forces.

Thus, through the application of the inventive methods described herein, the maximum level of lateral forces generated in thermocompression bonding is substantially reduced by applying corrective XY motions before a final force is applied. The corrective motions will lead to improved placement accuracy and reduced lateral forces.

The motions systems used to provide the corrective motions may desirably be existing motions systems used to drive the bonding tool (e.g., through a bond head assembly) and/or the support structure supporting the substrate. Such motion systems may include, for example, existing servo controlled linear motors. However, it will be appreciated that motion systems may be provided that have the specific function of providing the corrective motions.

Although the invention is described primarily in connection with providing substantially horizontal (e.g., along the x-axis and/or y-axis) corrective motions, it is understood that the corrective motions may have a vertical component, for example, in view of the lateral forces measured. Likewise, the lateral forces measured prior to determining the corrective motion may also have a vertical component, which may or may not be measured in connection with the inventive methods described herein, as desired in the given application.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of operating a thermocompression bonding system, the method comprising the steps of:
   (a) applying a first level of bond force to a semiconductor element while first conductive structures of the semiconductor element are in contact with second conductive structures of a substrate in connection with a thermocompression bonding operation;
   (b) measuring a lateral force related to contact between (i) ones of the first conductive structures and (ii) corresponding ones of the second conductive structures;
   (c) determining a corrective motion to be applied based on the lateral force measured in step (b); and
   (d) applying the corrective motion determined in step (c) wherein the step of applying the corrective motion includes moving at least one of the semiconductor element and the substrate along at least one substantially horizontal direction.

2. The method of claim 1 further comprising the step of (e) applying a second level of bond force to the semiconductor element after step (d), the second level of bond force having a magnitude greater than the first level of bond force.

3. The method of claim 1 wherein the lateral force measured in step (b) is related to a positional offset between ones of the first conductive structures and corresponding ones of the second conductive structures.

4. The method of claim 1 wherein the step of applying the corrective motion includes moving the substrate using a motion system adapted to move a support structure supporting the substrate.

5. The method of claim 1 wherein the step of applying the corrective motion includes moving the semiconductor element using a motion system adapted to move a bonding tool holding the semiconductor element.

6. The method of claim 1 wherein the step of applying the corrective motion includes moving the semiconductor element using a motion system adapted to move a bond head carrying the semiconductor element.

7. The method of claim 1 wherein the lateral force measured in step (b) is related to a horizontal positional offset between ones of the first conductive structures and corresponding ones of the second conductive structures, and wherein the step of applying the corrective motion includes moving at least one of the semiconductor element and the substrate by an amount substantially equal to the positional offset.

8. The method of claim 1 wherein the lateral force measured in step (b) is related to a horizontal positional offset between ones of the first conductive structures and corresponding ones of the second conductive structures, and wherein the step of applying the corrective motion includes moving at least one of the semiconductor element and the substrate by an amount greater than the positional offset.

9. The method of claim 1 wherein the step of applying the corrective motion includes applying a predetermined lateral force using a bond head carrying the semiconductor element.

10. The method of claim 1 wherein the step of determining the corrective motion includes determining the corrective action specific to a bonding location of the substrate configured to receive the semiconductor element.

11. The method of claim 1 wherein step (b) includes measuring the lateral force using a force sensor included in at least one of a bond head and a support structure of the thermocompression bonding system.

12. The method of claim 1 wherein step (b) includes measuring the lateral force by measuring motor current of at least one motor of a motion system for moving at least one of the semiconductor element and the substrate.

13. A method of operating a thermocompression bonding system, the method comprising the steps of:
 (a) measuring, at each of a plurality of bonding locations of a substrate, a lateral force related to contact between (i) ones of first conductive structures of a semiconductor element and (ii) corresponding ones of the second conductive structures of the substrate;
 (b) determining a corrective motion, specific to each of the plurality of bonding locations, to be applied based on the lateral force measured in step (a); and
 (c) applying the corrective motion at each of the plurality of bonding locations by applying a predetermined lateral force using at least one of a support structure of the thermalcompression bonding system and a bond head configured to carry the semiconductor element.

14. The method of claim 13 further comprising a step of applying a first level of bond force to a respective semiconductor element at each of the plurality of bonding locations, while first conductive structures of the respective semiconductor element are in contact with second conductive structures of a substrate prior to measuring the lateral force at each of a plurality of bonding locations of a substrate.

15. The method of claim 13 wherein the lateral force measured in step (a) is related to a positional offset between ones of the first conductive structures and corresponding ones of the second conductive structures.

16. The method of claim 13 wherein the corrective motion includes moving the substrate using a motion system adapted to move the support structure supporting the substrate.

17. The method of claim 13 wherein the corrective motion includes moving the semiconductor element using a motion system adapted to move a bonding tool holding the semiconductor element.

18. The method of claim 13 wherein the lateral force measured in step (a) is related to a horizontal positional offset between ones of the first conductive structures and corresponding ones of the second conductive structures, and wherein the corrective motion includes moving at least one of the semiconductor element and the substrate by an amount substantially equal to the positional offset at each of the plurality of bonding locations.

19. The method of claim 13 wherein the lateral force measured in step (a) is related to a horizontal positional offset between ones of the first conductive structures and corresponding ones of the second conductive structures, and wherein the corrective motion includes moving at least one of the semiconductor element and the substrate by an amount greater than the positional offset at each of the plurality of bonding locations.

20. The method of claim 13 wherein step (a) includes measuring the lateral force using a force sensor included in at least one of the bond head and the support structure of the thermocompression bonding system.

21. The method of claim 13 wherein step (a) includes measuring the lateral force by measuring motor current of at least one motor of a motion system for moving at least one of the semiconductor element and the substrate.

22. The method of claim 13 wherein the step of measuring in step (a) is repeated for each of the plurality of bonding locations for a plurality of substrates, and wherein step (b) includes determining the corrective motion, specific to each of the plurality of bonding locations, based on the lateral force measured in the repeated steps of measuring.

23. A thermocompression bonder comprising:
 a support structure for supporting a substrate;
 a bond head carrying a bonding tool for bonding a semiconductor element to the substrate, wherein at least one of the bond head and the support structure includes a force sensor for sensing a lateral force related to contact between (i) ones of first conductive structures of the semiconductor element and (ii) corresponding ones of second conductive structures of the substrate; and
 a motion system controlled to move at least one of the bond head and the support structure to apply a corrective motion along at least one substantially horizontal direction based on the lateral force sensed by the force sensor.

* * * * *